United States Patent [19]

Brown et al.

[11] Patent Number: 4,775,290
[45] Date of Patent: Oct. 4, 1988

[54] FLEXIBLE VACUUM GRIPPER

[75] Inventors: Laurie M. Brown, Seattle; Thomas H. O'Connor, Buckley; John C. Massenburg, Federal Way, all of Wash.

[73] Assignee: Flow Systems, Inc., Kent, Wash.

[21] Appl. No.: 822,868

[22] Filed: Mar. 3, 1986

[51] Int. Cl.[4] .............................................. B65G 00/00
[52] U.S. Cl. ................................... 414/752; 414/737; 414/744 B; 901/40; 294/65
[58] Field of Search ............. 901/40; 414/737, 744 B, 414/752; 248/309.3, 363; 279/3; 294/65

[56] References Cited

U.S. PATENT DOCUMENTS

| | | | |
|---|---|---|---|
| 2,455,650 | 12/1948 | Billner | 294/65 |
| 2,821,158 | 1/1958 | Brown et al. | 414/744 B X |
| 3,165,899 | 1/1965 | Shatto, Jr. | 901/40 X |
| 3,514,065 | 5/1970 | Litt et al. | 248/363 |
| 3,591,228 | 7/1971 | Webb | 294/65 |
| 3,648,853 | 3/1972 | Winne | 901/40 X |
| 3,659,678 | 5/1972 | Hall, Jr. | 248/363 |
| 3,668,498 | 6/1972 | Austin, Jr. | 901/40 X |
| 4,162,018 | 7/1979 | Arya | 414/752 X |
| 4,221,356 | 9/1980 | Fortune | 248/363 |

FOREIGN PATENT DOCUMENTS

| | | |
|---|---|---|
| 2377747 | 8/1978 | France . |
| 52-75770 | 6/1977 | Japan . |
| 2062577 | 5/1981 | United Kingdom . |

*Primary Examiner*—Robert J. Spar
*Assistant Examiner*—Jennifer Doyle
*Attorney, Agent, or Firm*—Ashen Golant Martin & Seldon

[57] ABSTRACT

A vacuum-type pickup and transfer apparatus for irregularly surfaced, shaped and sized objects such as populated printed wiring boards (PWBs) is disclosed. The apparatus includes a plurality of downwardly directed vacuum conduits that have enlarged lips at their lower end. It also includes a thin, flexible, non-porous membrane which extends transversely and loosely between the conduits and through which the conduits extend so that their lower ends communicate with the region below the membrane. The pick-up apparatus is moved down to the PWBs and vacuum applied, so that the flexible membrane seals against the PWBs, adapting and conforming to any irregular surfaces, sizes and shapes. The apparatus includes a control for selectively regulating the movement of the pick-up apparatus and the application of the vacuum. The PWBs are accordingly moved to the desired location and the vacuum released to release the PWBs.

12 Claims, 5 Drawing Sheets

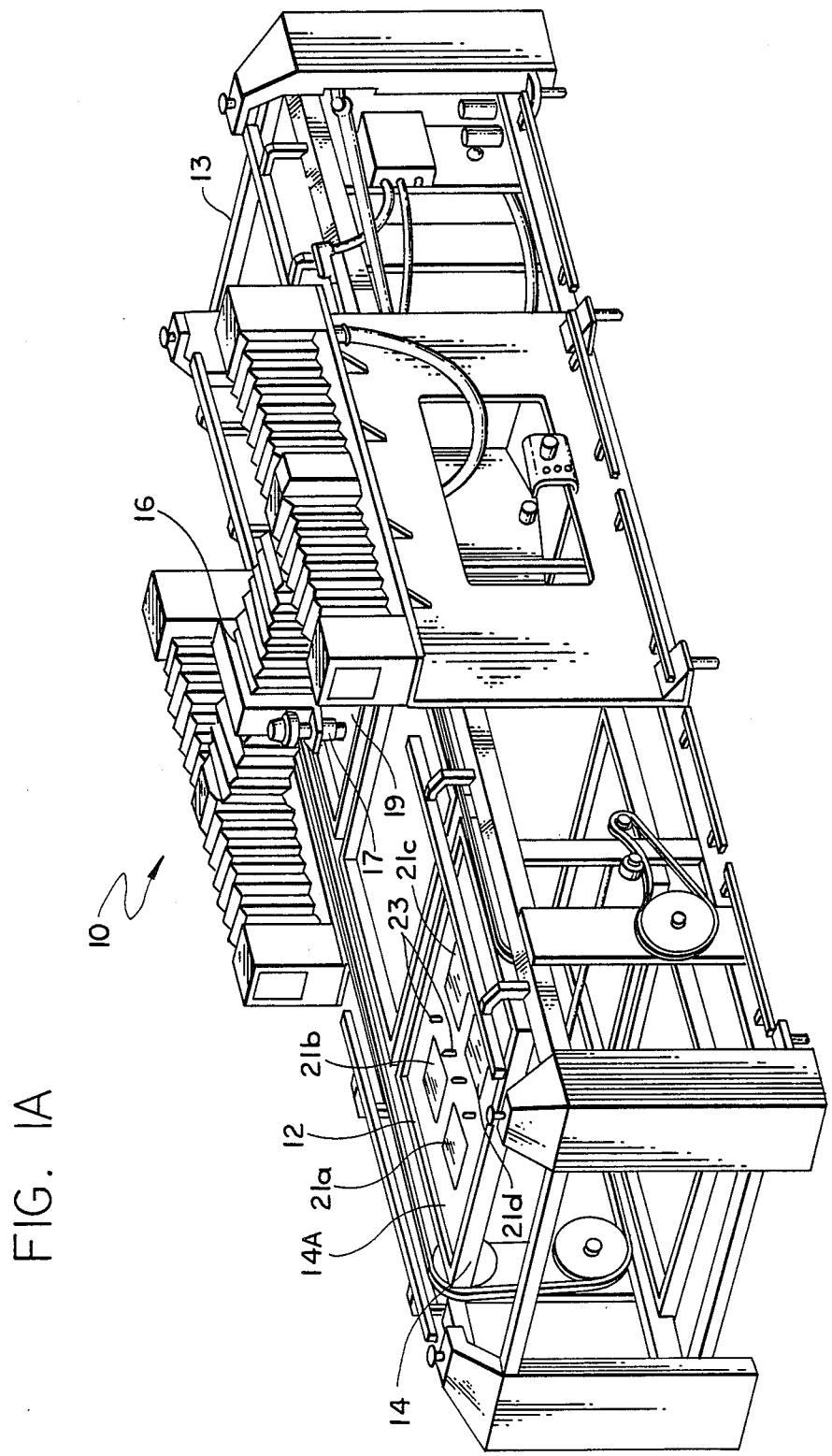

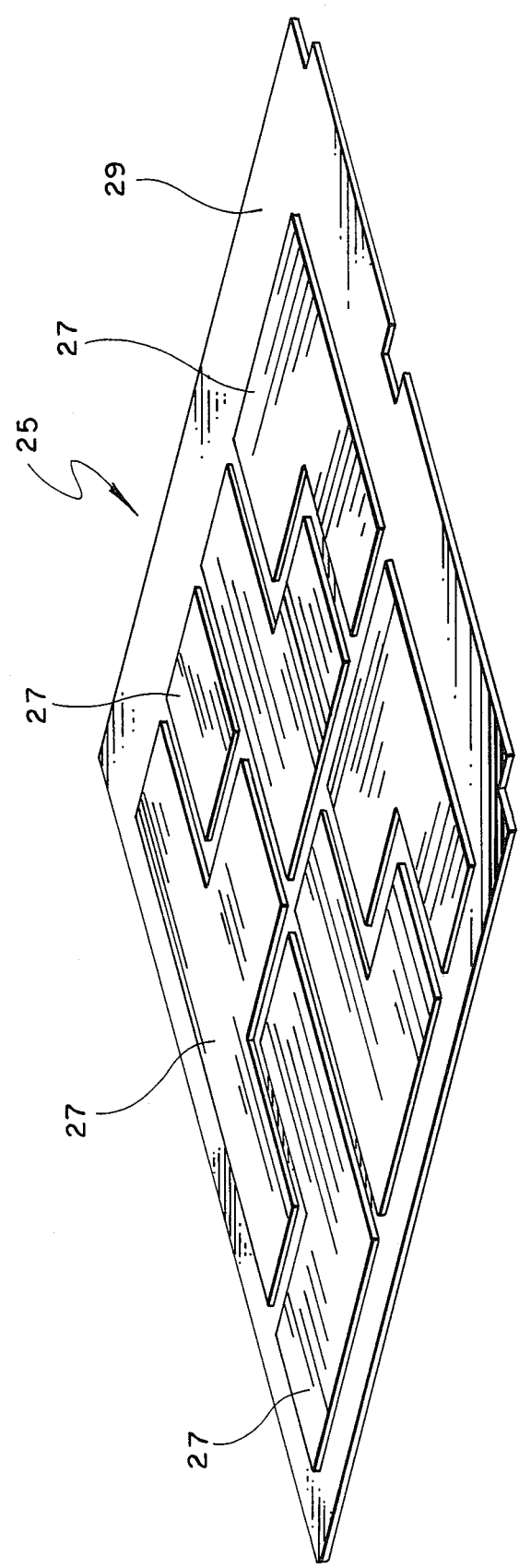
FIG. IB

FLEXIBLE VACUUM GRIPPER

BACKGROUND OF THE INVENTION

There has been a clear and felt need for a suitable pickup and transfer device for irregularly surfaced and/or different sized or shaped objects such as populated printed wiring boards (PWBs). The term "populated" refers to boards populated with electrical components. Accordingly, a pickup and transfer device will be described for use in conjunction with such PWB's, although those skilled in the art will recognize that the scope of the invention is not so limited.

Typically a plurality of individual printed wiring boards are cut from a master board by an x-y cutting machine that is part of an automated assembly line. One such cutting system is described in co-pending U.S. patent application Ser. No. 723,428, filed Apr. 15, 1985, and assigned to the assignee of the present application. The aforementioned application describes a fluid jet cutting system for cutting individual boards from a masterboard, and teaches that the fluid jet may advantageously be used to cut populated masterboards. By cutting the masterboards after component insertion, cleaning, etc., standardized tooling and other cost-reducing measures are possible.

The automatic pickup and transfer of populated printed wiring boards from one assembly line to another is highly desirable; however there have not been any commercially successful devices capable of reliably performing this labor-intensive task. This is particularly true if the pickup device must handle boards of varying topography and shape with minimal operator intervention. Additionally, it may also be important to maintain registration of the boards after the boards are transferred to facilitate their handling downstream.

Prior attempts to pick up populated printed wiring boards of variable size and shape have been limited to mechanical grippers. However, mechanical grippers must be positioned with respect to the edges of the board to be transferred. When a plurality of boards have been cut from a master board, and are to be removed from a platen, some of the edges may be blocked from the gripper by the adjacent edges of neighboring boards. Additionally, the movement of such grippers must be changed to accommodate changes in the shapes and sizes of the individual boards which may occur from one production run to the next.

Vacuum "grippers" are more flexible than mechanical grippers because they are less dependent on the specific locations of the boards' perimeters. In theory, a vacuum gripper can pick up a board so long as it makes contact with the board anywhere along its surface. While vacuum devices have been generally useful for picking up and moving objects, the prior art vacuum devices require that the vacuum device (typically a suction cup) engage the object to be grasped around the entire periphery of the cup in order to provide an adequate seal and maintain a hold on the object. When a portion of the periphery fails to seal, owing to blockage by the edge of a component, for example, the resulting leakage weakens the hold so that the object may not be picked up or may be dropped before reaching its intended destination. Thus, while vacuum grippers are highly desirable, they have been limited to use with unpopulated PC boards, or similar objects with smooth surfaces.

SUMMARY OF THE INVENTION

The present invention contemplates reliably and repeatedly picking up and transfering irregularly surfaced, sized and shaped objects such as populated printed wiring boards. The illustrated apparatus includes a pick up assembly comprising a plurality of generally downwardly extending vacuum conduits which extend through a thin, flexible, non-porous, generally horizontally extending membrane-like sheet. The sheet extends between the conduits, and hangs loosely between them so as to extend down below the level of conduits. Means are provided to retain the sheet away from the conduits, thereby preventing the sheet from blocking the conduits.

The pickup assembly is positioned closely over the irregularly surfaced object to be picked up, and a vacuum is drawn through the conduits. The membrane-like sheet compliantly adopts to and conforms to the surface and shape of the object's surface, such as an adjacent populated PWB.

In the case of populated printed wiring boards, the sheet seals against the board, while pliantly accommodating those portions of the PWB components which are radially adjacent to the conduits. In effect, the sheet forms a seal with the board along an irregular, generally continuous periphery radially outwardly of the vacuum conduit. This peripheral seal accordingly defines a vacuum chamber or compartment circumventing each conduit, which chamber includes portions of board components which have heretofore prevented sealing.

The board is thus held by the pickup assembly, and is moved to a desired remote location. At the remote location, the vacuum is removed to release the board. The movements and vacuum application may be controlled by suitable microprocessor control means.

It may be noted that a plurality of such conduits may be utilized to simultaneously pick up and transfer a like plurality of boards without a loss of board position or orientation. In such a configuration, the sheet conforms itself into a plurality of vacuum chambers, each circumventing a respective conduit, and each capable of assuming a required irregular shape in order to effect the vacuum pick up and transfer.

Additional features and details concerning the invention are provided in the following Description of the Preferred Embodiment, of which the drawing is a part.

BRIEF DESCRIPTION OF THE DRAWING

FIG. 1A is a perspective view of an X-Y cutting system;

FIG. 1B is a schematic perspective view of several representative irregularly surfaced, shaped and sized individual fully loaded printed wiring boards cut from a master board by the system of FIG. 1A;

DESCRIPTION OF THE PREFERRED EMBODIMENT

Figure 2:
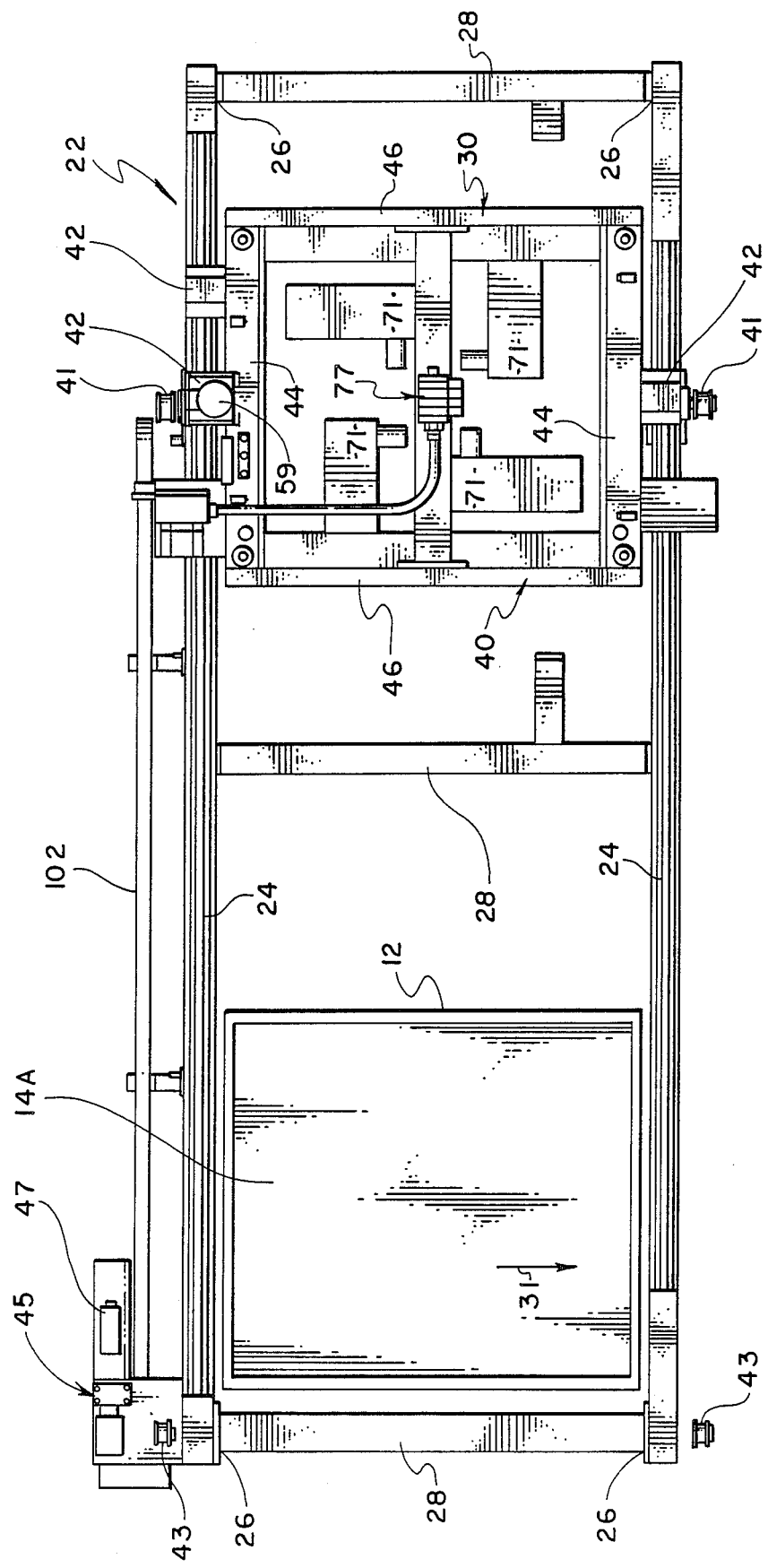
FIG. 2 is a simplified top plan view of a pick-up and transfer device constructed in accordance with the invention for picking up and transfering irregularly surfaced, sized and shaped objects such populated printed wiring boards illustrated in FIG. 1B.

FIG. 1A is a perspective view of a multi-station conveyor-type x-y cutting system 10 of the type utilizing a fluid jet as the cutting medium. The system 10 is known in the art and does not form a part of the present invention, but is illustrated merely as one environment for the invention.

Briefly, the cutting system 10 includes a plurality of generally rectangular platens 12. The platens are moved, in a stepped manner, along an upper processing level and a lower return level by means of a conveyor belt or chain. The platens move along the upper level from an on-load station 13 to an off-load station 14. A cutting station 19 is provided between the on-load and off-load stations. A fluid jet nozzle 17 is mounted on an X-Y table 16 above the cutting station for bi-directional movement over the platen. As the platen bearing the masterboard pauses at the cutting station while the masterboard is cut, the platen behind it is loaded at the on-load station, and the platen at the off-load station is unloaded.

Each platen is typically sized to hold four master boards. Although only one fluid jet nozzle is illustrated at the cutting station for clarity, four fluid jet nozzles are typically provided at the cutting station so that the four masterboards may be cut simultaneously. Accordingly, each platen supports a tooling plate 21 having four cut-out regions, or quadrants 21a, 21b, 21c, 21d and a plurality of precisely located tooling pins 23. The masterboards include accurately positioned pin-receiving holes which receive the tooling pins and accurately locate each masterboard over a respective one of the four quadrants.

FIG. 1B is a pespective view of a cut masterboard 25. The masterboard has been cut into a plurality of individual PWB's 27. A peripheral scrap piece 29 is also illustrated. The masterboard, and thus the individual PWB's, are populated by electronic components, whose bodies extend upwardly from the upper surface of the boards to form an irregular topography. The lack of a smooth topography is an important aspect which will be discussed further below.

A pickup and transfer apparatus 20 constructed in accordance with the present invention is illustrated in FIGS. 2 through 5. FIG. 2 is a top plan view. As shown in FIG. 2, the apparatus comprises a generally rectangular self-standing open frame 22 positioned at the off-load station 14 (FIG. 1). A platen 12 is illustrated at the left side of FIG. 2 for orientation. Its direction of movement, conveniently referred to as "longitudinal" is indicated by the arrow 31.

The frame 22 includes a pair of longitudinally spaced-apart support rails 24 above the off-load station. The support rails 24 extend laterally from the off-load station. A movable pick up assembly 30 is supported by the rails 24 for lateral movement between the off-load station and a transversely remote position.

Figure 3:
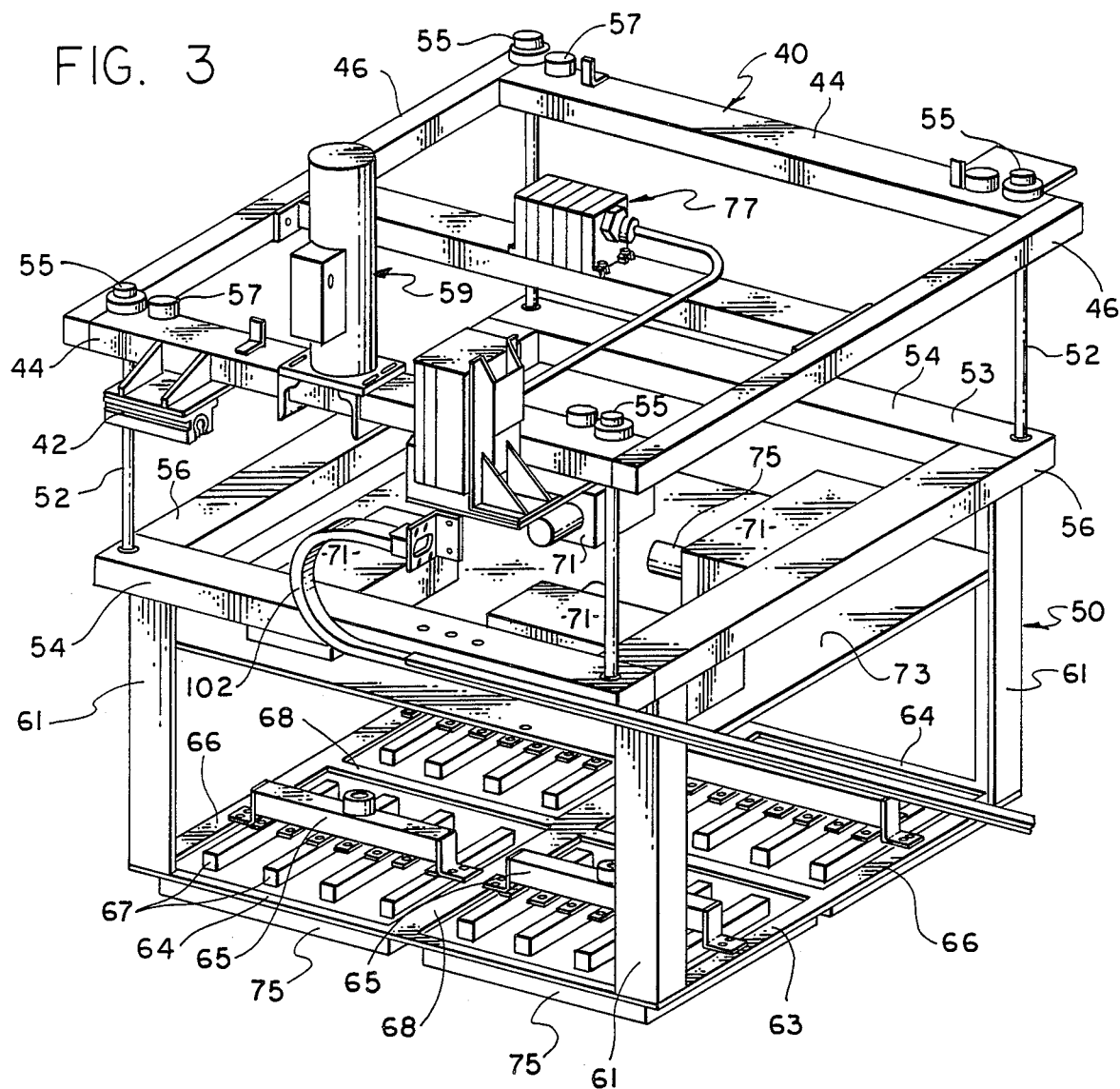
FIG. 3 is a simplified perspective view of the movable gripper portion of the apparatus of FIG. 2.

The movable pick-up assembly 30 is illustrated in perspective in FIG. 3. The assembly 30 includes an upper carriage 40 mounted for movement on the support rails 24, and a lower, vertically movable, pickup section 50 that is suspended from the upper carriage 40 by four upright ballscrews 52.

The lower pickup section 50 is a generally open, rectangular, box-like structure having an upper end 53 made up of two side members 54 and two end members 56 secured to each other. The ballscrews 52 are positioned at the rectangular corners, extending between the upper support section 40 and the upper end 53 of the lower pickup section.

Each ball screw 52 mates with a respective threaded nut (not shown) in a corner of the upper end 53 of the lower pickup section 50. Ball screws are devices known in the art, having threads in the form of double helixes. The spacing between the double threads is dimensioned to accept a plurality of small ball bearings captured between the mating double threads of the nut. The bearings act as the interface between the screw and nut, minimizing friction as the screw turns within the nut.

The ball screws 52 are rotated to raise and lower the lower pick-up section 50 with respect to the upper carriage 40. Accordingly, each ball screw 52 extends upwardly through the upper carriage 40, where it terminates in a pulley wheel 55. A suitable belt (not shown) extends around the pulley wheels 55 and is maintained in engagement with the pulley wheels by respective idler wheels 57 adjacent to each pulley wheel. The belt is driven by a reversible motor 59 affixed to the upper carriage 40. When the belt is driven in one direction, the ball screws 52 rotate so as to lower the pickup section 50; when the belt is driven in the opposite direction, the ball screws 52 rotate so as to raise the pickup section.

The bottom, platen-facing portion of the lower pick-up section 50 includes four quadrants of vacuum devices dimensioned to overlie the four quadrants in the tooling plate 21 (FIG. 1) respectively. Each quadrant of vacuum devices includes a header 65 and four manifolds 67, described in more detail hereinbelow.

The vacuum devices are supported by the structure of the lower pick-up section 50, which comprises four vertically-extending corner posts 61. The bottom face 63 of the pick-up section 50 includes a generally rectangular frame formed from two side members 64 and two end members 66. Two intersecting intermediate members 68 respectively extend from the midpoints of the side and end members, dividing the bottom face into the four areas or quadrants.

A vacuum header 65 is secured across and above each of the open quadrant areas. Each header has an input port on its top surface in fluid communication with four output ports on its bottom surface. Each header supports four manifolds 67, each of which extends transversely to the direction of the header (i.e. in the longitudinal direction). The manifolds 67 each have an input port formed on its top surface, and four longitudinally-spaced output ports formed on its bottom surface. The input port and output ports of each manifold communicate via an internal fluid path.

Figure 4:
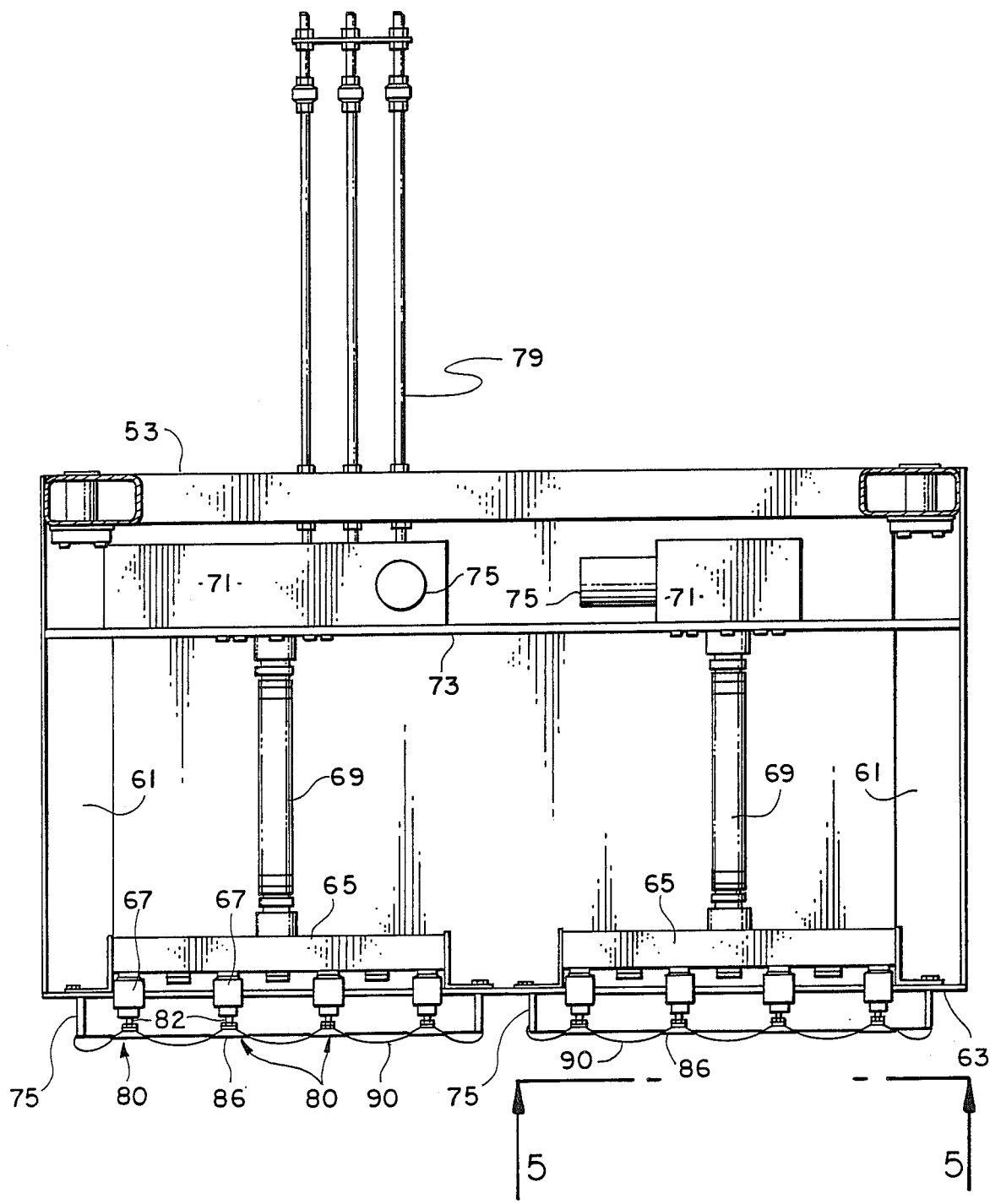
FIG. 4 is a simplified side elevational view of the gripper of FIG. 3.

FIG. 4, a simplified elevation view of the pick-up assembly 50, shows the manifolds 67 each supporting four longitudinally spaced, cup-shaped members 80. Each of the headers 67 is coupled by a conduit 69 to a respective vacuum pump 71 mounted on the pickup section. The pumps 71 are preferably air-driven Venturi-type pumps, which are relatively compact, reliable, and light in weight, compared to piston-driven pumps. Accordingly, Venturi-type pumps are more easily moved about with the carriage 40. Four vacuum pumps 71, each connected to one of the four headers 65, are utilized so that the vacuum to each of the four quadrants can be separately and selectively controlled or turned off as desired.

The cups 80 each depend downwardly from the manifold and include a vertically extending internal fluid path communicating with a respective output port in the manifold. An orifice in the bottom surface of each cup places the manifold's output port in fluid communication with the region underlying the cup.

Each of the illustrated vacuum cups 80 comprises an upper, externally threaded, tubular conduit portion 82 which screws into mating threads formed in the output port of the manifold. Additional threaded ports in the manifold may be provided for accommodating cups at alternative positions. The ports not occupied by vacuum cups are plugged by suitable plugs.

The lower end of each vacuum cup member 80 is formed as a radially enlarged, annular lip 86. The lip 86 is somewhat flexible, although shape-retaining, and may be conveniently formed from rubber or plastic. The thickness of the lip may decrease from its central region to the outer edge. Good results have been achieved with a lip having a 1½ inch diameter.

A thin, flexible, non-porous sheet-like membrane 90 traverses the quadrant along the bottom face of the pick-up assembly 50. The membrane is secured to the perimeter of the quadrant by suitable securing means. A separate membrane may be utilized for each quadrant, or a single membrane sheet may traverse all four quadrants and be secured to the periphery of the pickup assembly 50.

The membrane 90 is at least partially supported by the enlarged lips 86 of the vacuum cups 80, so that the membrane traverses the quadrant in a draped manner whereby it hangs loosely below the level of the vacuum cups. The membrane accordingly includes a plurality of cup-receiving through-holes of smaller cross-section than the cross-section of the lips. Because the lips are somewhat flexible, they may be compressed radially, permitting the sheet to be passed upwardly around the lips. When released, the lips assume their normal shape and cross-sectional dimension, preventing the membrane from slipping down.

The vacuum cups 80 and the membrane 90 are lowered down over the printed wiring boards by the rotation of the ball screws 52 (FIG. 3). When a vacuum is applied through the vacuum cups, the loose, flexible membrane 90 will tend to conform to the irregular contour of the adjacent board and components, forming a seal therewith. The seal is along an irregular, generally continuous periphery which extends around and is radially outwardly of the vacuum cup.

Figure 5:
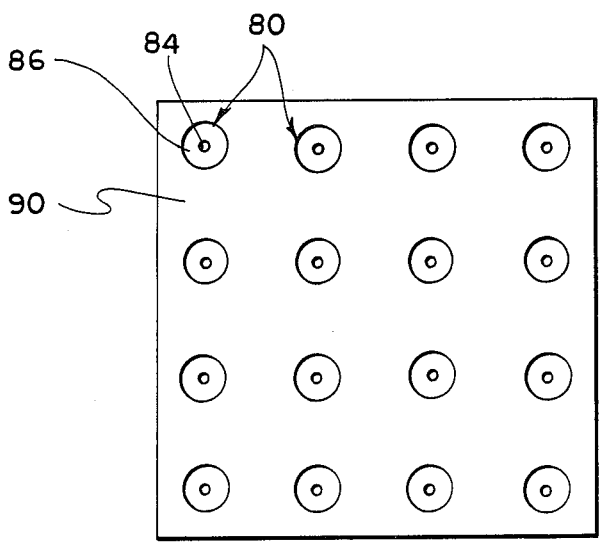
FIG. 5 is a bottom plan view showing a quadrant of the gripper of FIGS. 3 and 4.

It will be noted that the generally annular and outwardly extending lip 86 of the vacuum cup serves to retain the membrane in a position which does not block the conduits. First, it holds the membrane above the vacuum-drawing conduit. Second, it restrains adjacent portions of the membrane away from the cup's orifice, preventing the membrane from being sucked into the vacuum conduit 84 when the vacuum is applied. FIG. 5 is a bottom end view of the pickup section showing the arrangement and the configuration of the illustrated vacuum cup lips.

As previously described, the membrane is thin, flexible and non porous. It should also resist being torn by sharp edges of components, connector pins, and so forth. It should also be borne in mind that a sharp object impacting the membrane will be located at the same position on each PWB of a production run, thereby causing repeated impacting of the same membrane location. The preferable material should accordingly be somewhat elastic for added tear resistance.

In practice, very satisfactory results have been achieved using a latex sheet of approximately 0.006 inch thickness. Such sheets have been marketed to dentists for placement around the tooth of a patient. Although tear-resistant, it is a very flexible, non-porous material capable of sealing to the board's surface within the small spaces between components; i.e. it is sufficiently contour-conforming for the present application.

Returning to FIG. 2, the mechanism for effecting movement of the gripper assembly 30 along the rails 24 is explained. A reversible motor drive unit 45, mounted on the frame 22, drives an adjacent pulley wheel 43 located at one of the top, longitudinally rearward corners of the frame 22. A drive belt loops around the pulley wheel 43 and three other wheels; one of the other wheels 41 is at the laterally opposite corner of the frame, while the other two wheels are vertically below the wheels 43, 41 and accordingly unillustrated in the plan view.

A similar drive belt system is provided on the longitudinally forward side of the frame 22. The motor drive unit 45 is accordingly coupled via a drive shaft 28 to a pulley wheel 47 at the top, longitudinally forward corner of the frame 22.

The upper carriage 40 is supported on the rails 24 for lateral movement, and is attached to the two drive belts by respective couplers 42. Activation of the motor unit 45 causes lateral movement of the carriage 40 and, consequently, the pick-up assembly 30.

The control and synchronization of the apparatus may be by a suitable preprogrammed or programmable microprocessor connected to the carriage by suitable electrical cables 102 (FIG. 3). When a platen 12 containing cut individual PWBs reaches the off-load station, the upper carriage 40 is moved transversely along the rails by motor unit 57 to a position above the platen. The motor 59 on upper carriage 40 is activated, causing the ball screws to rotate, and the pick-up unit to move downward towards the platen.

The cups 80 and membrane 90 are thereby placed against the boards to be picked up, and a vacuum is drawn through the central orifices in the cups 80 by the pumps 77. The membrane 90 adopts the contour of the boards underlying it, creating a vacuum chamber between the membrane and board surface whose shape accomodates the board's components.

The motor 59 is activated in the reverse direction, rotating the ball screws in the opposite direction, thereby lifting the pick-up assembly towards the upper carriage. The PWB's are accordingly lifted, while maintaining their orientation and spatial relationship. The upper carriage is moved laterally away from the platen, the pick-up assembly lowered towards a board-supporting structure such as a production line conveyor belt, and the vacuum is shut off, releasing the boards.

It is recognized that various modifications may be made to the disclosed embodiment by those skilled in the art having the benefit of this disclosure, without departing from the spirit and scope of the invention. It is accordingly intended that the invention be defined solely by the appended claims, and that the claims be interpreted as broadly as permitted by the prior art to include all equivalent devices and methods.

We claim:

1. A vacuum-type pick-up and transfer device for use with irregularly surfaced objects comprising:
   (a) a thin, non-porous flexible membrane-like sheet of material having a plurality of through-holes;

(b) a plurality of fluid-conducting conduits extending generally downward through the through-holes of said sheet the conduits including sheet-retaining means of relatively enlarged cross-sectional dimension to support the portion of sheet adjacent a through hole above the conduit opening so as to retain the sheet away from the conduit opening, the cross-sectional dimension of the through-holes being less than the cross-sectional dimension of the sheet-retaining means, the sheet retaining means being reversibly distortable into lesser cross-sectional dimension for insertion through a through-hole in the material;

(c) means for selectively drawing air from under the sheet via the conduits;

(d) means for moving the sheet towards an object to be picked up, the material being conformable to the irregular surface to form as seal thereto when air is drawn from under the sheet.

2. The device of claim 1 including a generally horizontally movable pickup assembly;

a generally vertically movable pickup section supported on said assembly and upon which the conduits are mounted in spaced-apart relationship;

means operatively associated with said device for selectively controlling the lateral movement of said pickup assembly and the vertical movement of said pickup section, for moving said assembly between a pickup position immediately above objects to be picked up and a remote position away from said pickup position; and means operatively connected to the device for drawing a vacuum through said conduits, the material being disposed generally horizontally and loosely between said conduits so that when said pickup section is positioned immediately above an object to be picked up and vacuum is drawn through said conduits, said material will compliantly form a generally irregular, continuous peripheral seal with the object to be picked up, thereby releasably securing the object to the pickup assembly.

3. The device of claim 1 wherein the membrane-retaining means includes a lip on at least some of the conduits, the lips having a relatively enlarged cross-sectional dimension to hold a portion of the sheet above the opening of the conduit.

4. The device of claim 2 wherein said sheet hangs down between the conduits below the level of the conduits.

5. The device of claim 1 wherein said material is somewhat elastic.

6. The device of claim 3 wherein said lips are annular.

7. The device of claim 3 wherein said lips are somewhat flexible, but shape-retaining.

8. The device of claim 2 including a supporting rail assembly upon which the laterally movable pickup assembly is mounted for movement toward and away from the pickup position.

9. The apparatus of claim 2 further including screw means for supporting the pick-up section from the pickup assembly at a controllable adjustable distance.

10. The device of claim 9 wherein the screw means includes a plurality of ball screws, rotatable to controllably raise and lower said pickup section.

11. The device of claim 2 wherein said means for drawing a vacuum comprises a Venturi-type vacuum pump mounted for movement with said carriage.

12. A vacuum-type pick-up and transfer device for use with irregularly surfaced objects comprising:

a thin, non-porous sheet of latex material approximately 0.006 inches thick;

a plurality of fluid-conducting conduits extending generally downward through the sheet;

sheet retaining means for supporting the sheet away from the conduit openings;

means for selectively drawing air from under the sheet via the conduits; and means for moving the sheet towards an object to be picked up, the material being conformable to the irregular surface to form a seal thereto when air is drawn from under the sheet.

* * * * *